US007918681B2

(12) United States Patent
Ju

(10) Patent No.: US 7,918,681 B2
(45) Date of Patent: Apr. 5, 2011

(54) ELECTRICAL CONNECTOR

(75) Inventor: Ted Ju, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 12/458,301

(22) Filed: Jul. 8, 2009

(65) Prior Publication Data

US 2011/0008977 A1 Jan. 13, 2011

(51) Int. Cl.
*H01R 13/625* (2006.01)
(52) U.S. Cl. ........................................................ 439/342
(58) Field of Classification Search .................... 439/68, 439/259–266, 331, 342–345
See application file for complete search history.

(56) References Cited

U.S. PATENT DOCUMENTS

| 6,500,019 B1 * | 12/2002 | Tan ............................... 439/342 |
| 7,056,140 B1 * | 6/2006 | Jiang ............................. 439/342 |
| 2005/0215102 A1 * | 9/2005 | Yu et al. ........................ 439/342 |

FOREIGN PATENT DOCUMENTS

TW M350163 2/2009

* cited by examiner

*Primary Examiner* — Briggitte R Hammond
*Assistant Examiner* — Larisa Z Tsukerman
(74) *Attorney, Agent, or Firm* — Rosenberg, Klein & Lee

(57) ABSTRACT

An electrical connector includes a base having a through hole, a cover body slidably located on the base, a plurality of pins received in the base, a pushing piece installed on the upper surface of the cover body and having an opening, and a driving device for pushing the cover body and the base to have a relative motion. The cover body has a receiving hole that passes through the upper surface and the lower surface of the cover body. The driving device is received in the through hole, the opening, and the receiving hole. The driving device has an upper blocking portion and a lower blocking portion. The pushing piece, the cover body, and the base are located between the upper blocking portion and the lower blocking portion, in order to prevent the cover body from warping to cause the driving device being operated abnormally.

13 Claims, 15 Drawing Sheets

ELECTRICAL CONNECTOR

BACKGROUND OF THE INVENTION

1. Field of the Invention

The present invention relates to an electrical connector; in particular, the present invention relates to an electrical connector that carries a chip module and connects the chip module to a circuit board.

2. Description of Related Art

For laptops, the electrical connector therein that carries a chip module and connects the chip module to a circuit board includes a base, a plurality of conducting pins received in the base, an upper cover slidably assembled with the base, and a cam driving device for driving the upper cover to slide on the base. When the electrical connector is used, the chip module is placed on the upper cover. Next, the cam driving device is rotated to push the upper cover to move to another side so that the pins of the chip module are contacted with the conducting pins. While the upper cover is pushed, the conducting pins exert a force to the pins and the force is transmitted to the upper cover. Therefore, one side of the upper cover that is installed with the cam driving device warps upwards so that the cam driving device cannot be operated normally.

Taiwan patent 97208841 discloses an improved electrical connector. The electrical connector includes a base, a plurality of pins, a cover body, a cam, and a fastening element. The cam has a disk portion, an eccentric portion, an operating portion, a positioning portion, and a holding trough. The disk portion is received in the receiving room of the base. The eccentric portion and the operating portion are received in the receiving hole of the cover body. The fastening element has a base disk and an extending column. The base disk is located in a concave room of the base. The extending column extends into and is fastened in the holding trough of the cam to position the cam between the base and the cover body. By using a tool to drive the operating portion, the eccentric portion drives the cover body to move between the first location and the second location.

The improved electrical connector still has following drawbacks.

1. Because the eccentric portion and the operating portion of the cam are received in the receiving hole of the cover body, it cannot limit the upper cover in the vertical direction so that the upper cover still warps upwards. Thereby, the cam driving device cannot be operated normally.

2. In addition to occupying part of the base by the fastening element, the disk portion of the cam also occupies a lot of part of the base so that the strength of the base is weak and easily deforms. In a worse case, the base may break so that cam driving device cannot be operated normally.

SUMMARY OF THE INVENTION

One particular aspect of the present invention is to provide an electrical connector that assures that a driving device operation is normal.

The electrical connector includes a base having a receiving hole, a cover body slidably located on the base, a plurality of pins received in the base, a pushing piece installed on the upper surface of the cover body and having an opening, and a driving device for pushing the cover body and the base to have a relative motion. The cover body has a through hole that corresponds to the receiving hole and passes through the upper surface and the lower surface of the cover body. The driving device is received in the receiving hole, the opening, and the through hole. The driving device has an upper position-limit portion and a lower position-limit portion connected with the upper position-limit portion. The pushing piece, the cover body, and the base are located between the upper position-limit portion and the lower position-limit portion.

The electrical connector includes a base having a receiving hole, an upper cover slidably located on the base, a plurality of pins received in the base, and a driving device for pushing the upper cover and the base to have a relative motion. The upper cover has a through hole that corresponds to the receiving hole and passes through the upper surface and the lower surface of the upper cover. The driving device includes an upper driving element and a lower driving element. The upper driving element has an operating portion and a pushing portion. The pushing portion is received in the through hole. The lower driving element has a fastening portion and the fastening portion is received in the receiving hole.

The electrical connector of the present invention locates the pushing piece, the cover body, and the base between the upper position-limit portion and the lower position-limit portion so that the upper cover presses on the base to prevent the upper cover from warping to cause the driving device being operated abnormally. Alternatively, by respectively receiving the upper driving element and the lower driving element in the through hole of the upper cover and the receiving hole of the base, the problem of the thickness of the base being thinner due to the base being occupied and being easily deformed is avoided. The problem of the driving device being operated abnormally is resolved.

For further understanding of the present invention, reference is made to the following detailed description illustrating the embodiments and examples of the present invention. The description is for illustrative purpose only and is not intended to limit the scope of the claim.

DETAILED DESCRIPTION OF THE PREFERRED EMBODIMENTS

Figure 1:
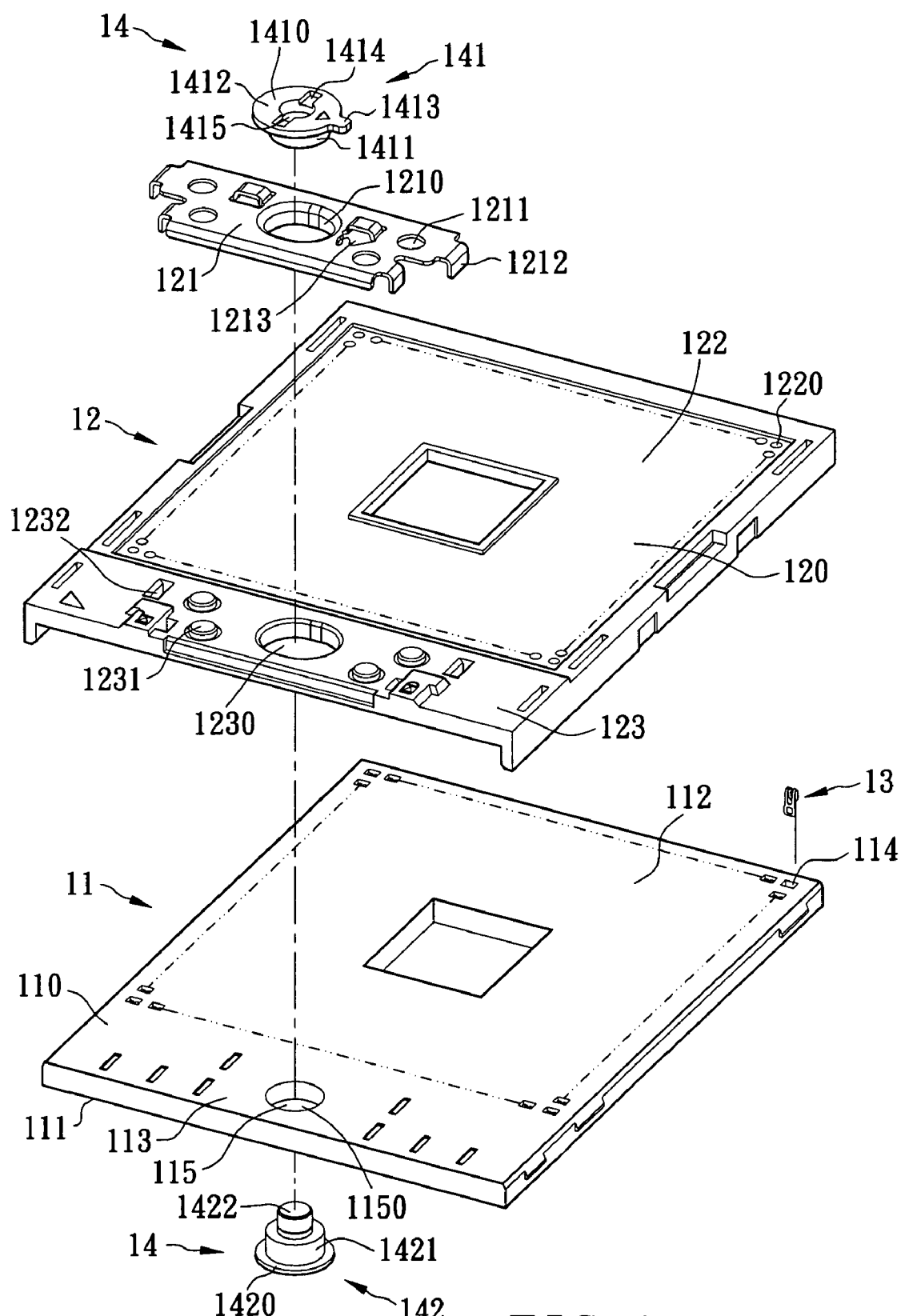
FIG. 1 is an exploded perspective view of the electrical connector of the first embodiment of the present invention.
Figure 2:
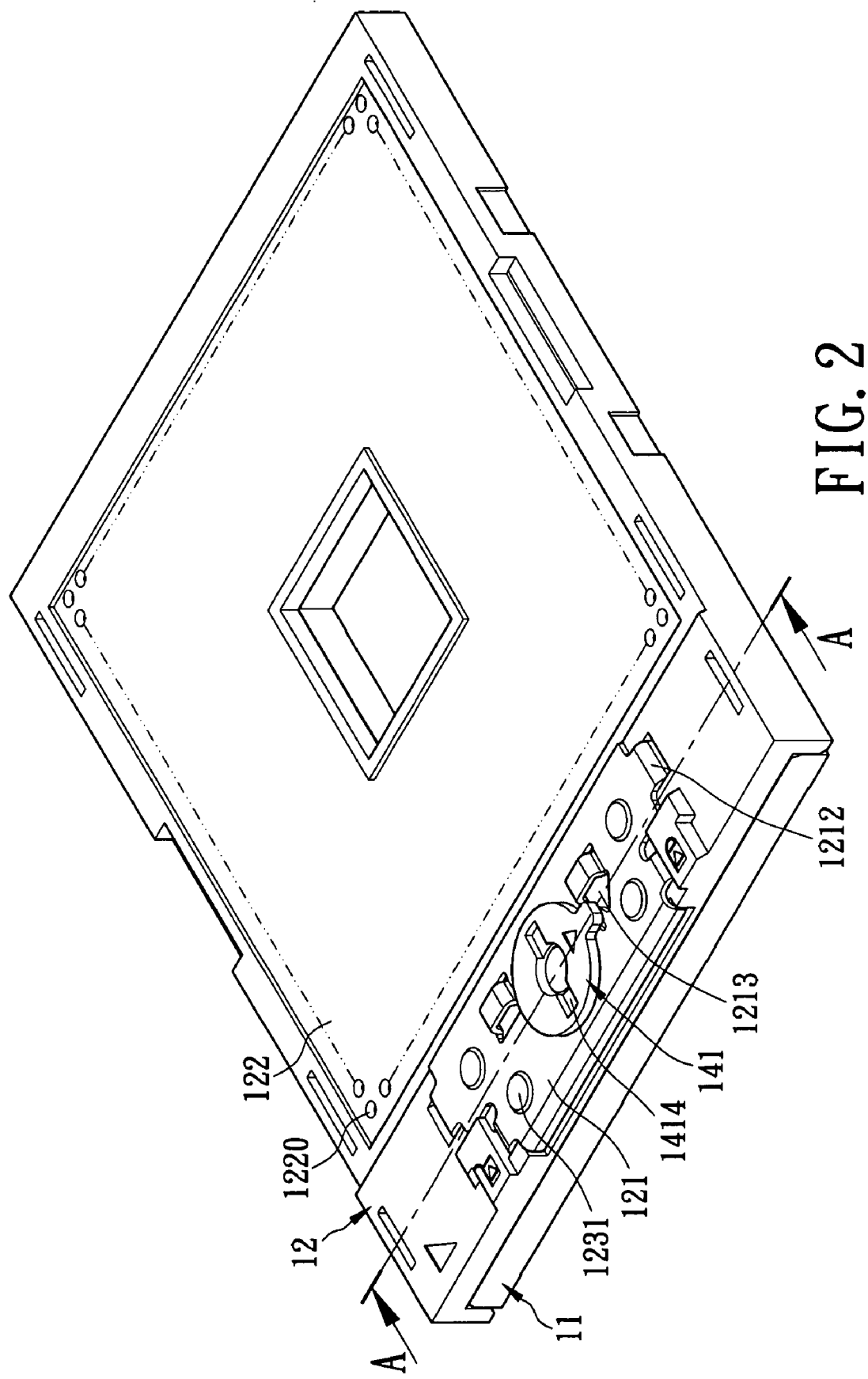
FIG. 2 is an assembly perspective view of the electrical connector of the first embodiment of the present invention.
Figure 3:
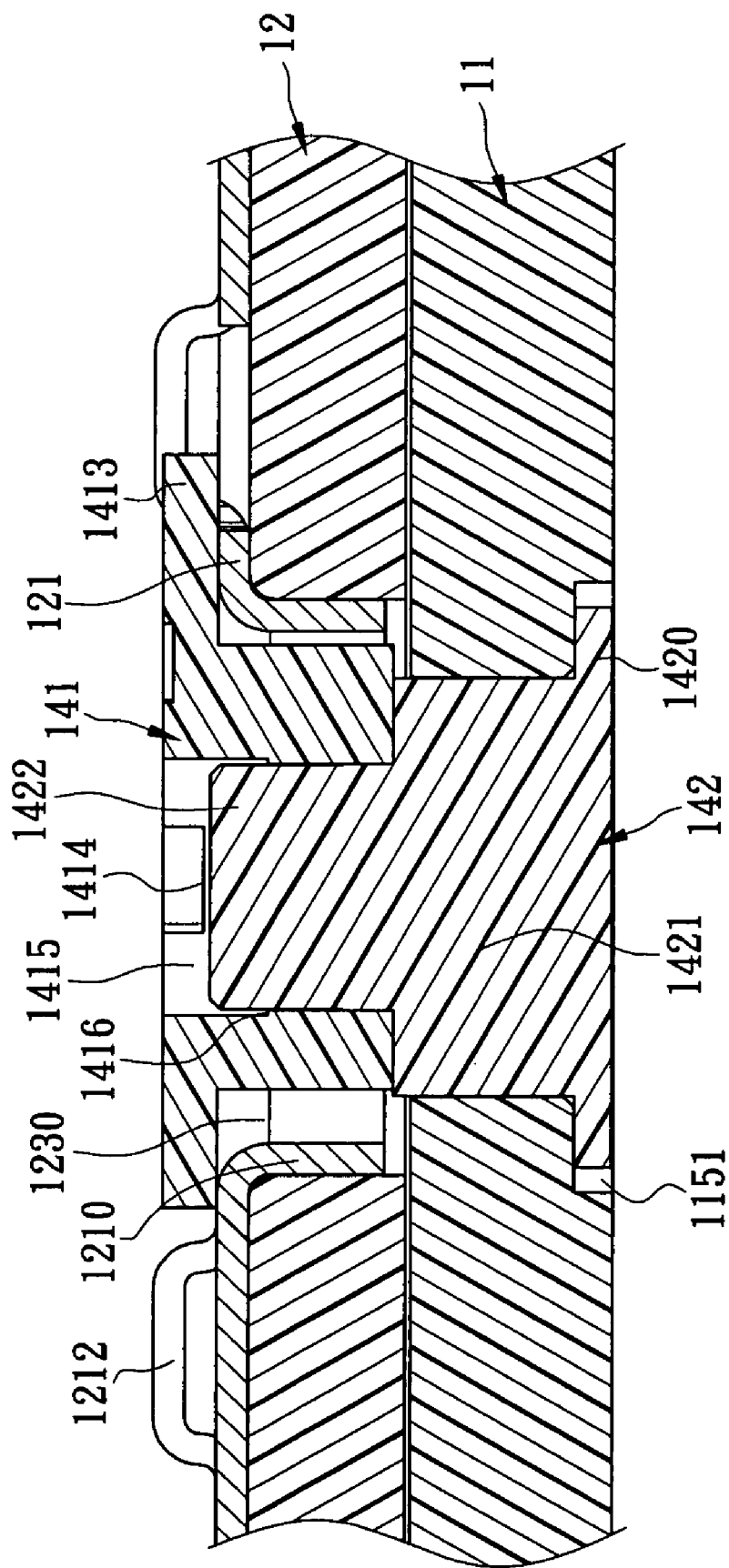
FIG. 3 is a cross-sectional diagram of the cross-section A-A in FIG. 2.
Figure 4:
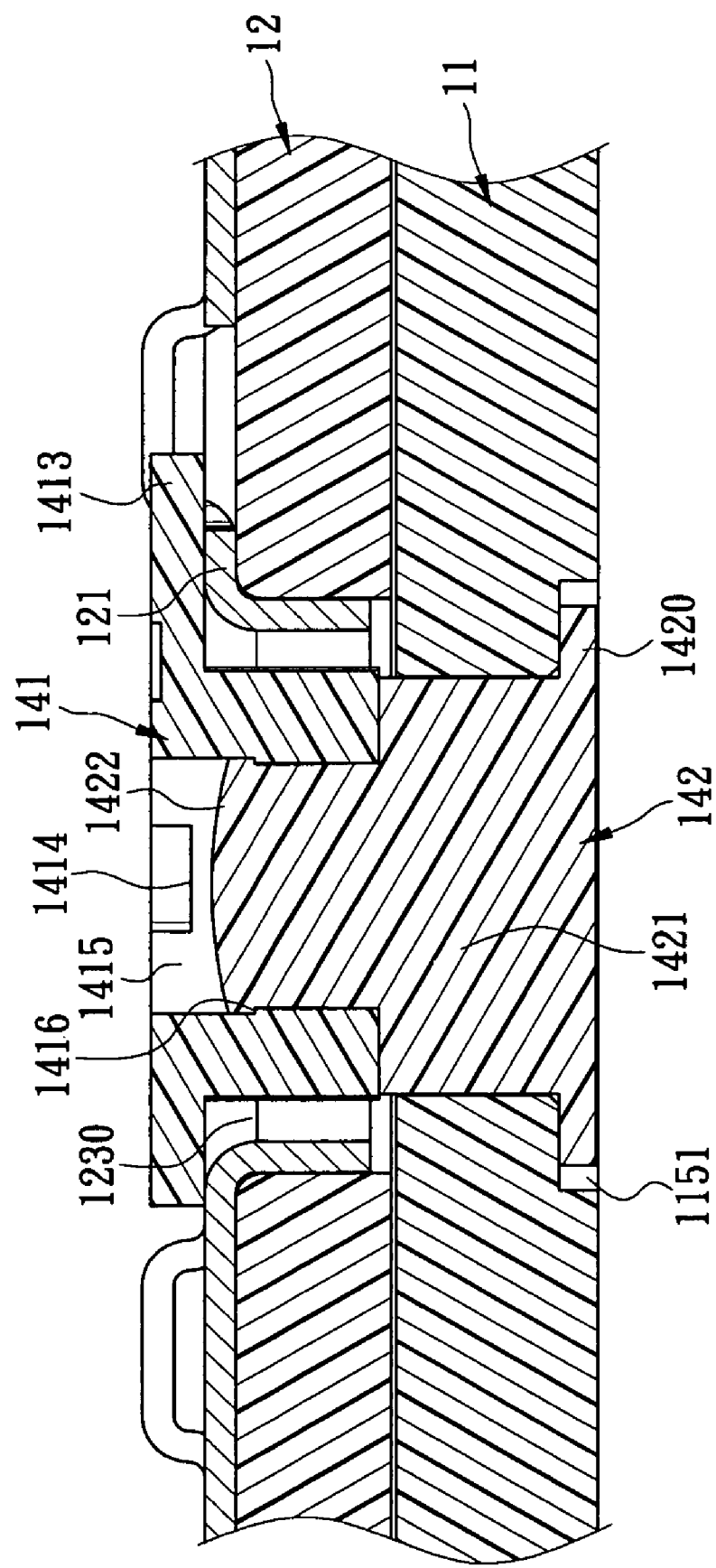
FIG. 4 is a schematic diagram of the lower driving element being riveted with the upper driving element in FIG. 3.
Figure 5:
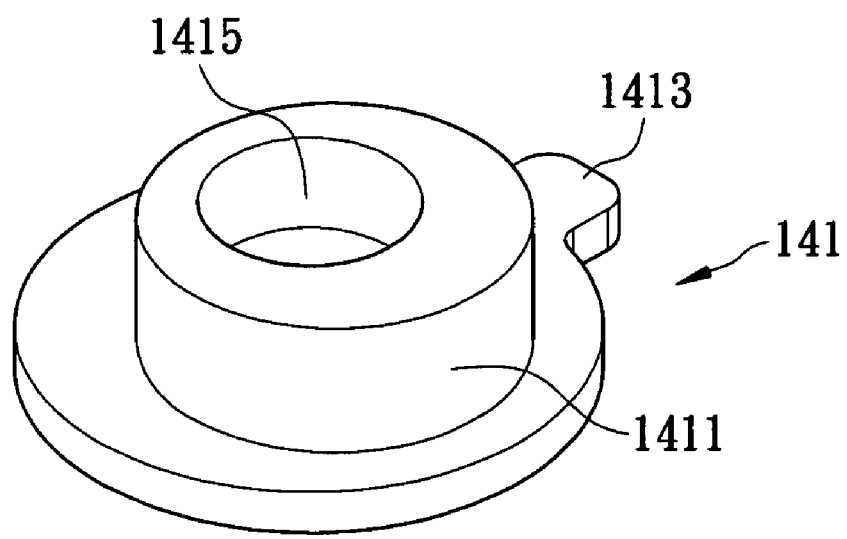
FIG. 5 is a perspective view of the upper driving element in FIG. 1.
Figure 6:
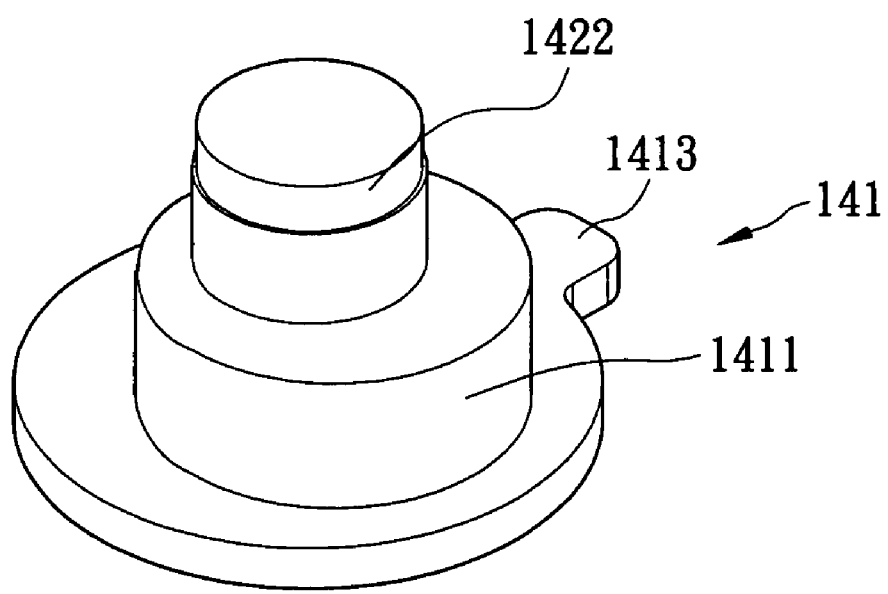
FIG. 6 is a perspective view of the upper driving element of the electrical connector of the second embodiment of the present invention.
Figure 7:
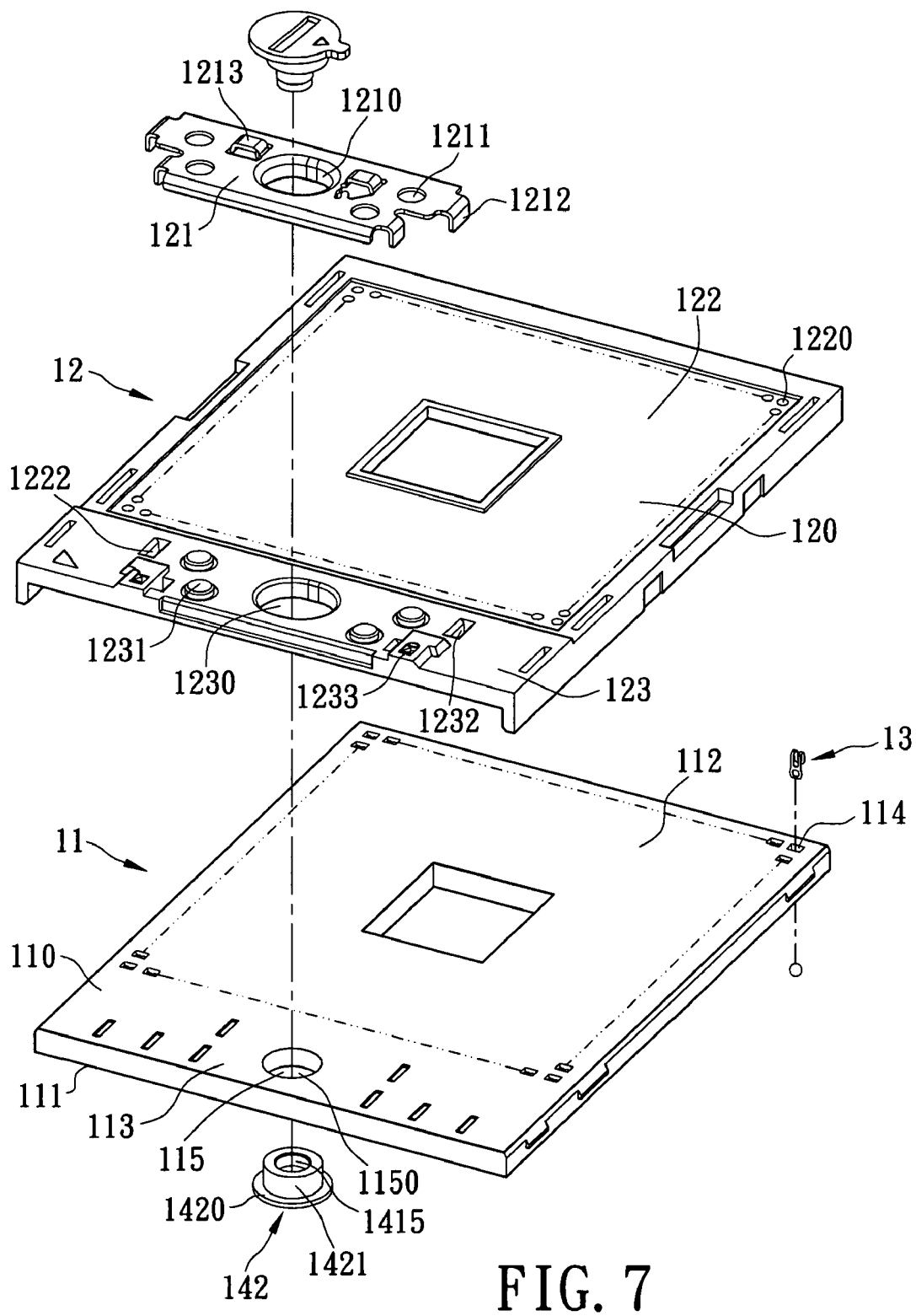
FIG. 7 is an exploded perspective view of the electrical connector of the second embodiment of the present invention.
Figure 8:
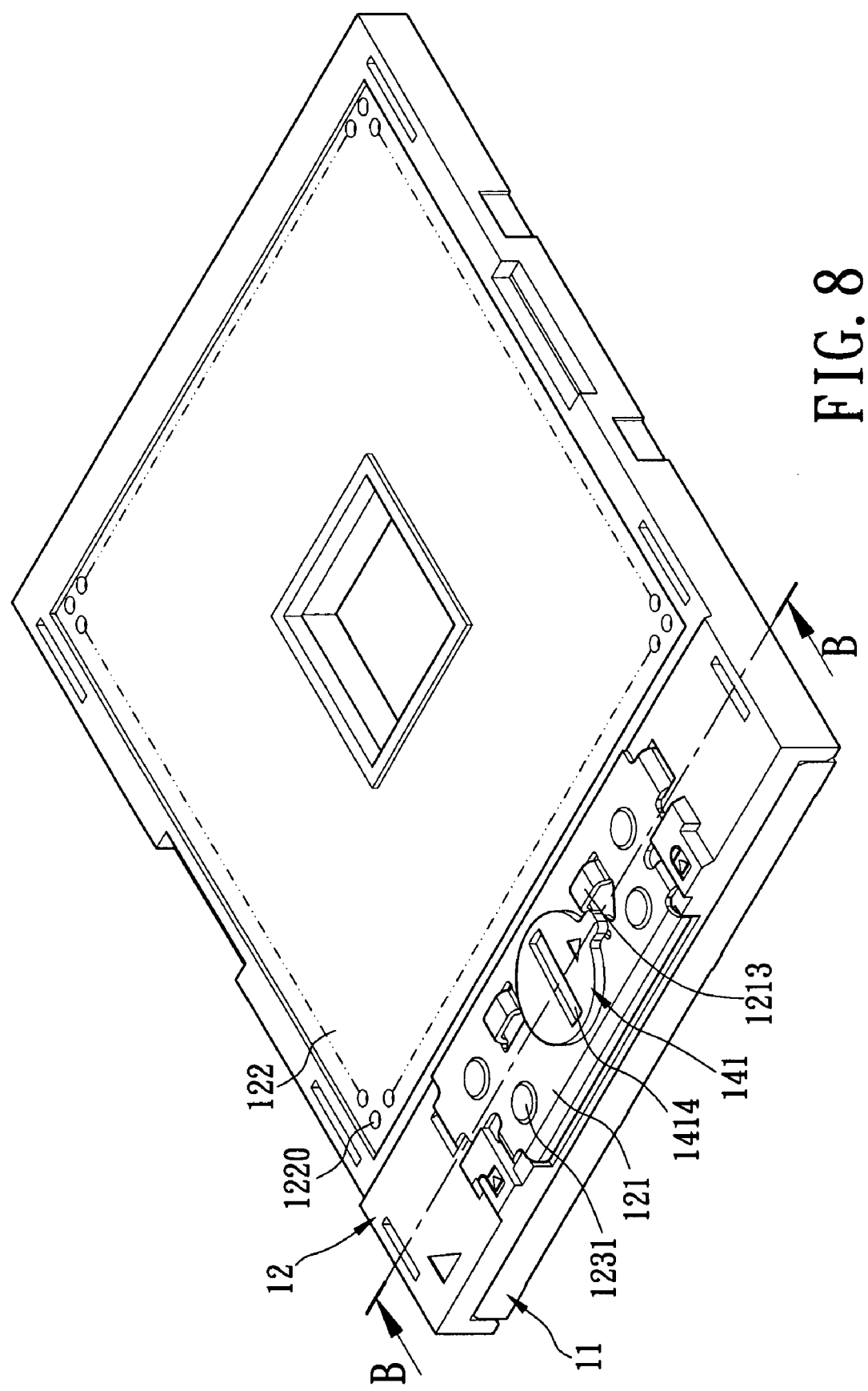
FIG. 8 is an assembly perspective view of the electrical connector in FIG. 7.
Figure 9:
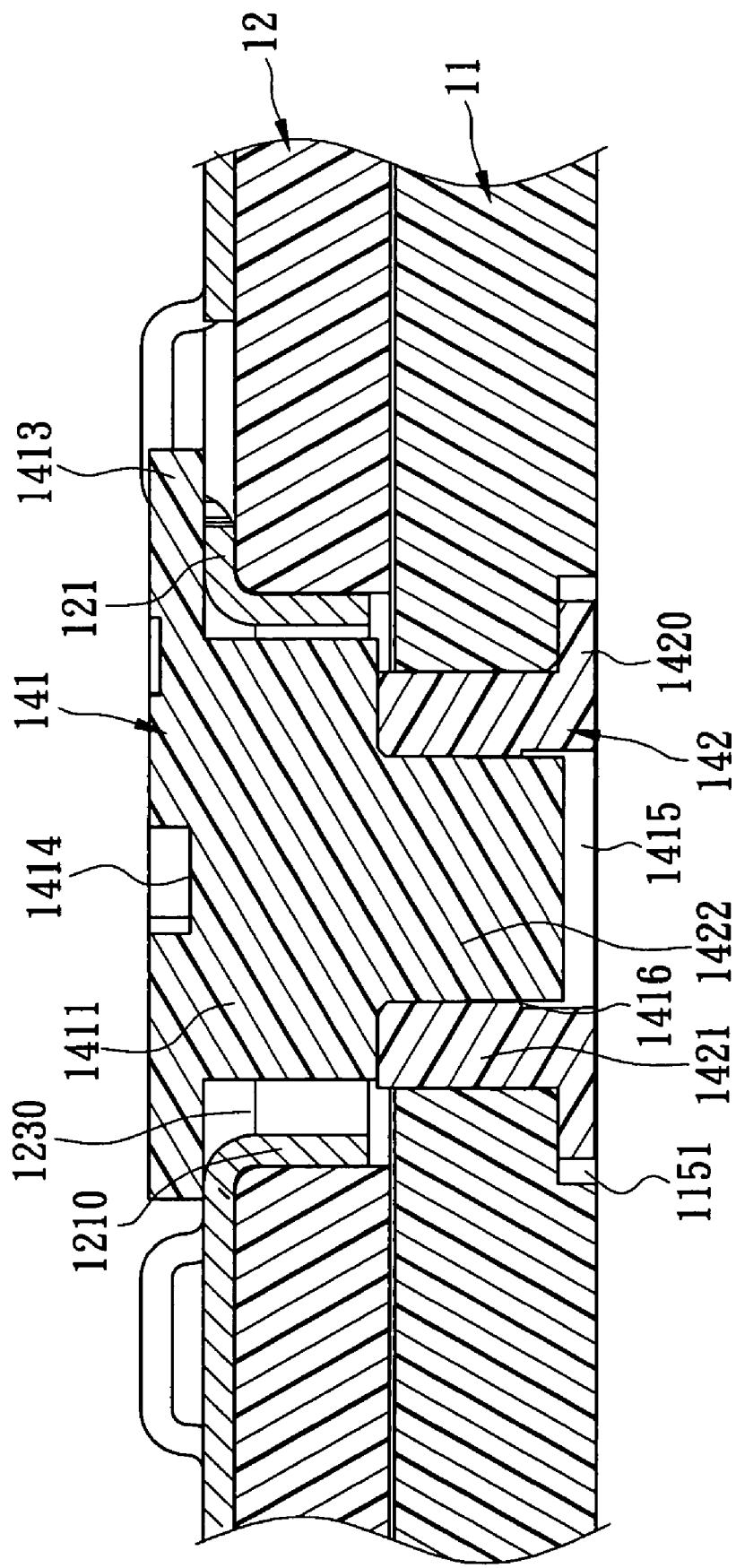
FIG. 9 is a cross-sectional diagram of the cross-section B-B in FIG. 8.
Figure 10:
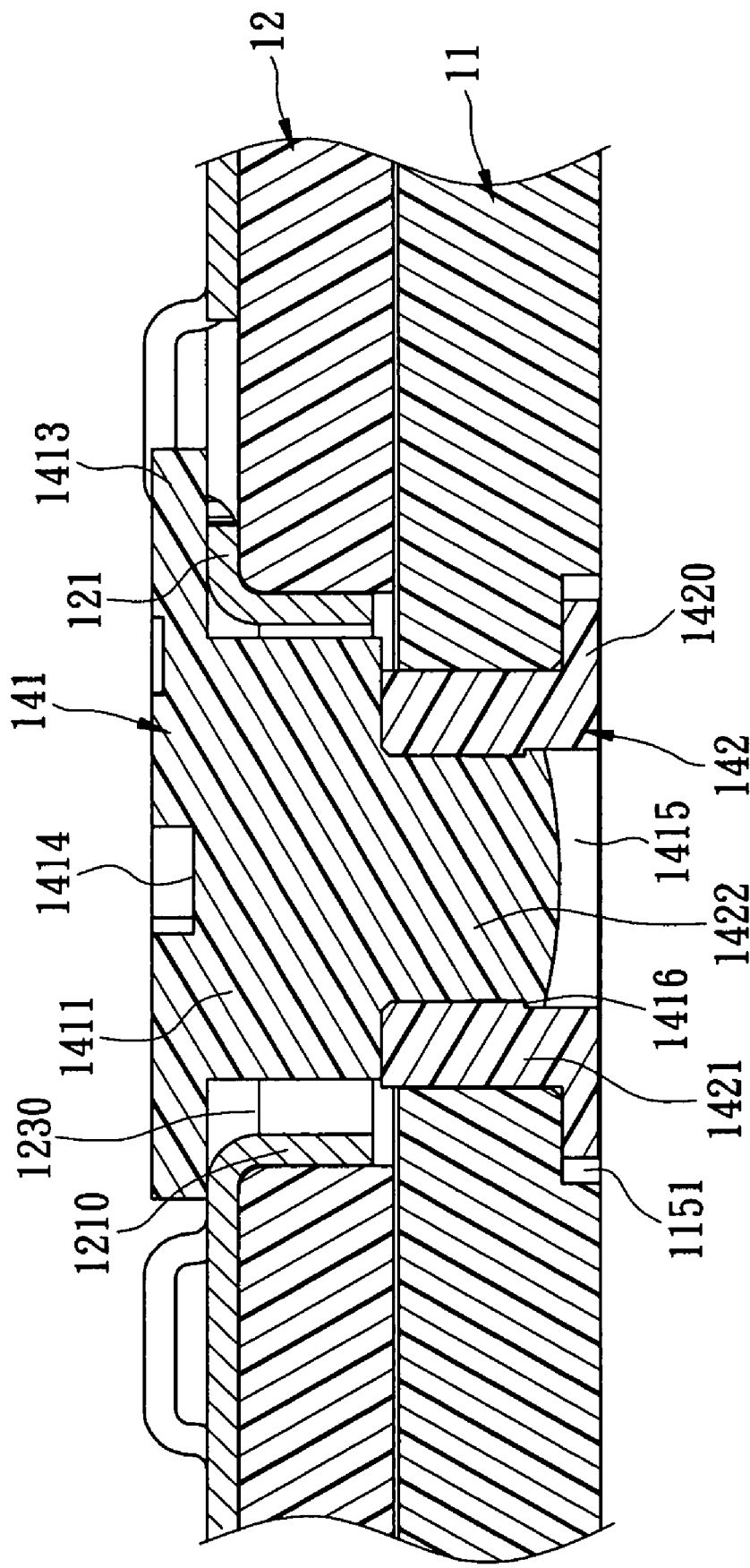
FIG. 10 is a schematic diagram of the lower driving element being riveted with the upper driving element in FIG. 9.

Reference is made to FIGS. 1-5, which show an electrical connector of the first embodiment of the present invention. The electrical connector 1 is electrically conducted with a circuit board (not shown in the figure). The electrical connector 1 includes a base 11, an upper cover 12 slidably located on the base 11, a plurality of conducting pins 13 received in the base 11, and a driving device 14 for driving the upper cover 12 to slide on the base 11.

The base 11 has an upper surface 110 and a lower surface 111, and has a larger conducting area 112 and a smaller driving area 113 that are disposed in parallel. The conducting area 112 has a plurality of pin-receiving holes 114 for receiving the conducting pins 13. The center of the driving area 113 has a circular receiving hole 115. The receiving hole 115 passes through the upper surface 110 and the lower surface 111, and includes an upper opening portion 1150 and a lower opening portion 1151. The diameter of the lower opening portion 1151 is larger than the diameter of the upper opening portion 1150.

The upper cover 12 includes a cover body 120 injected by plastic material, and a pushing piece 121 formed by having a metal material being punched. The cover body 120 has a plugging hole area 122 and a head portion 123 that respectively correspond to the conducting area 112 and the driving area 113 of the base 11. The plugging hole area 122 has a plurality of plugging holes that correspond to the pin-receiving holes 114. The center of the head portion 123 has a through hole 1230 that is elliptical and corresponds to the receiving hole 115. Two sides of the through hole 1230 respectively have two convex columns 1231 and two square holes 1232 that are symmetrically disposed.

The center of the pushing piece 121 is drawn downwards to form a sleeve 1210. The sleeve 1210 has an opening. The shape of the sleeve 1210 is the same as the shape of the through hole 1230, and the sleeve 1210 is smaller than the through hole 1230. Two sides of the pushing piece 121 respectively have two small circular holes 1211 that are symmetrical, two fastening piece 1212 that are formed by bending and extending downwards, and a convex flakes 1213 that is formed by punching upwards. The convex columns 1231 and the fastening pieces 1212 respectively correspond to the small circular holes 1211 and the square holes 1232.

The conducting pins 13 are respectively located in each of the pin-receiving holes 114. The upper end of the conducting pin 13 is conducted with the corresponding pin (not shown in the figure) of a chip module, and the lower end of the conducting pin 13 is welded and conducted with the welding point on the circuit board (not shown in the figure).

The driving device 14 is used for driving the upper cover 12 to slide on the base 11, and includes an upper driving element 141 and a lower driving element 142 that are rotatably connected.

The upper driving element 141 has an operating portion 1410 and a pushing portion 1411 that are stacked. The operating portion 1410 includes a circular main body 1412 and a blocking piece 1413 that extends outwards from an edge of the main body 1412. The diameter of at least part of the main body 1412 is larger than the inner diameter of the sleeve 1210. The center of the main body 1412 has a square concave trough 1414 for being plugged with a screwdriver or other tools to perform the rotation operation. The pushing portion 1411 is column-shaped and has a fastening hole 1415. The fastening hole 1415 passes through the pushing portion 1411 and the operating portion 1410 (alternatively in another embodiment, the fastening hole 1415 may not pass through the pushing portion 1411 and the operating portion 1410). The fastening hole 1415 is eccentric to the pushing portion 1411. This means that the circular center of the fastening hole 1415 and the circular center of the pushing portion 1411 are not located on the same straight line. Moreover, the lower end of the inner surface of the fastening hole 1415 protrudes to form a ring convex portion 1416 so that the fastening hole 1415 is similar to a stage.

The lower driving element 142 has a lower position-limit portion 1420, a middle portion 1421, and a riveting portion 1422. The riveting portion 1422 forms a fastening portion. The lower position-limit portion 1420, the middle portion 1421, and the riveting portion 1422 are circular column-shaped, their diameters become smaller and smaller, and their center lines are located on the same straight line. The diameter of the lower position-limit portion 1420 is smaller than the diameter of the lower opening portion 1151, and is larger than the diameter of the upper opening portion 1150. The diameter of the middle portion 1421 is almost equal to the diameter of the pushing portion 1411, and is slightly smaller than the diameter of the upper opening portion 1150. The diameter of the riveting portion 1422 is slightly smaller than the diameter of the fastening hole 1415. The height of the middle portion 1421 is equal to the height of the upper opening portion 1150. The height of the lower position-limit portion 1420 is equal to or slightly smaller than the height of the lower opening portion 1151. The height of the riveting portion 1422 is higher than the height of the circular ring convex portion 1416.

When the electrical connector is assembled, the pushing piece 121 is downwards located on the head portion 123 so that the fastening pieces 1212 are interfered and fastened with the square holes 1232 and the convex columns 1231 are interfered and fastened with the small circular holes 1211. The sleeve 1210 is sleeved on the inner surface of the through hole 1230. Thereby, the pushing piece 121 is located on the cover body 120. The conducting pins 13 are plugged into the corresponding pin-receiving holes 114. Next, the upper cover 12 is covered on the base 11 so that the through hole 1230 corresponds to the receiving hole 115.

Next, the driving device 14 is installed. The upper driving element 141 is plugged into the through hole 1230 of the upper cover 12 from up to down. The operating portion 1410 is stopped on the upper surface of the pushing piece 121. The pushing portion 1411 is received in the through hole 1230, and the sleeve 1210 of the pushing piece 121 is located between the pushing portion 1411 and the inner surface of the through hole 1230. Thereby, the pushing piece 121 can prevent the driving device 14 from wearing the inner surface of the through hole 1230 of the upper cover 12 and prevent the hole-enlarging symptom from occurring so that the electrical connector is operated abnormally. Next, the lower driving element 142 is plugged into the receiving hole 115 from the lower surface 111 of the base 11. The lower position-limit portion 1420 is received in the lower opening portion 1151 to block the lower driving element 142 from dropping outside of the receiving hole 115 upwards. The middle portion 1421 is received in the upper opening portion 1150. The riveting portion 1422 extends into the fastening hole 1415 of the upper driving element 141. By using a tool to deform the riveting portion 1422, the riveting portion 1422 is riveted with the convex portion 1416 in the fastening hole 1415. Thereby, the upper driving element 141 is connected with the lower driving element 142.

Thereby, the electrical connector is assembled. The upper driving element 141 is riveted and connected with the lower driving element 142. The pushing piece 121, the upper cover 12 and the base 11 are located between the main body 1412 of the upper driving element 141 and the lower position-limit portion 1420 of the lower driving element 142. The main body 1412 forms an upper position-limit portion to block the pushing piece 121 to forcedly press the pushing piece 121 and the upper cover 12 on the base 11 to prevent the upper cover 12 from being warped.

While the driving device 14 is being driven, a screwdriver or a tool is plugged into the square concave trough 1414 to rotate. Due to the pushing portion 1411 of the upper driving element 141 being eccentrically located with the fastening hole 1415, the pushing portion 1411 drives the upper cover 12 to slide. The upper cover 12 stops rotating due to the blocking piece 1413 being blocked by the convex flake 1213. Alternatively, by eccentrically locating the middle portion 1421 of the lower driving element 142 with the riveting portion 1422 and concentrically locating the pushing portion 1411 and the fastening hole 1415 of the upper driving element 141, the driving device 14 drives the upper cover 12 to slide on the base 11. While sliding, only the lower position-limit portion 1420 of the lower driving element 142 occupies the thickness of the base 11. Comparing to the prior art, the thickness of the base 11 exerted by the rotation force is very large so that the base 11 does not become deformed and the driving device 14 can be smoothly rotated.

Reference is made to FIGS. 6-10, which show the second embodiment. The difference between the second embodiment and the first embodiment is described below.

The upper driving element 141 has a pushing portion 1411 and a riveting portion 1422 that extends from the pushing portion 1411. The lower driving element 142 does not have a riveting portion. The middle portion 1421 has the fastening hole 1415. The fastening hole 1415 has the convex portion 1416. The pushing portion 1411 and the riveting portion 1422 of the upper driving element 141 are eccentrically disposed, and the middle portion 1421 and the fastening hole 1415 of the lower driving element 142 are concentrically disposed. Alternatively, being same as the first embodiment, the middle portion 1421 and the fastening hole 1415 of the lower driving element 142 are eccentrically disposed, and the pushing portion 1411 and the riveting portion 1422 of the upper driving element 141 are concentrically disposed.

By riveting the riveting portion 1422 of the upper driving element 141 with the convex portion 1416 in the fastening hole 1415 of the lower driving element 142, the upper driving element 141 is connected with the lower driving element 142. This embodiment also can achieve the same goal and effect of the first embodiment, therefore is not repeated again.

Figure 11:
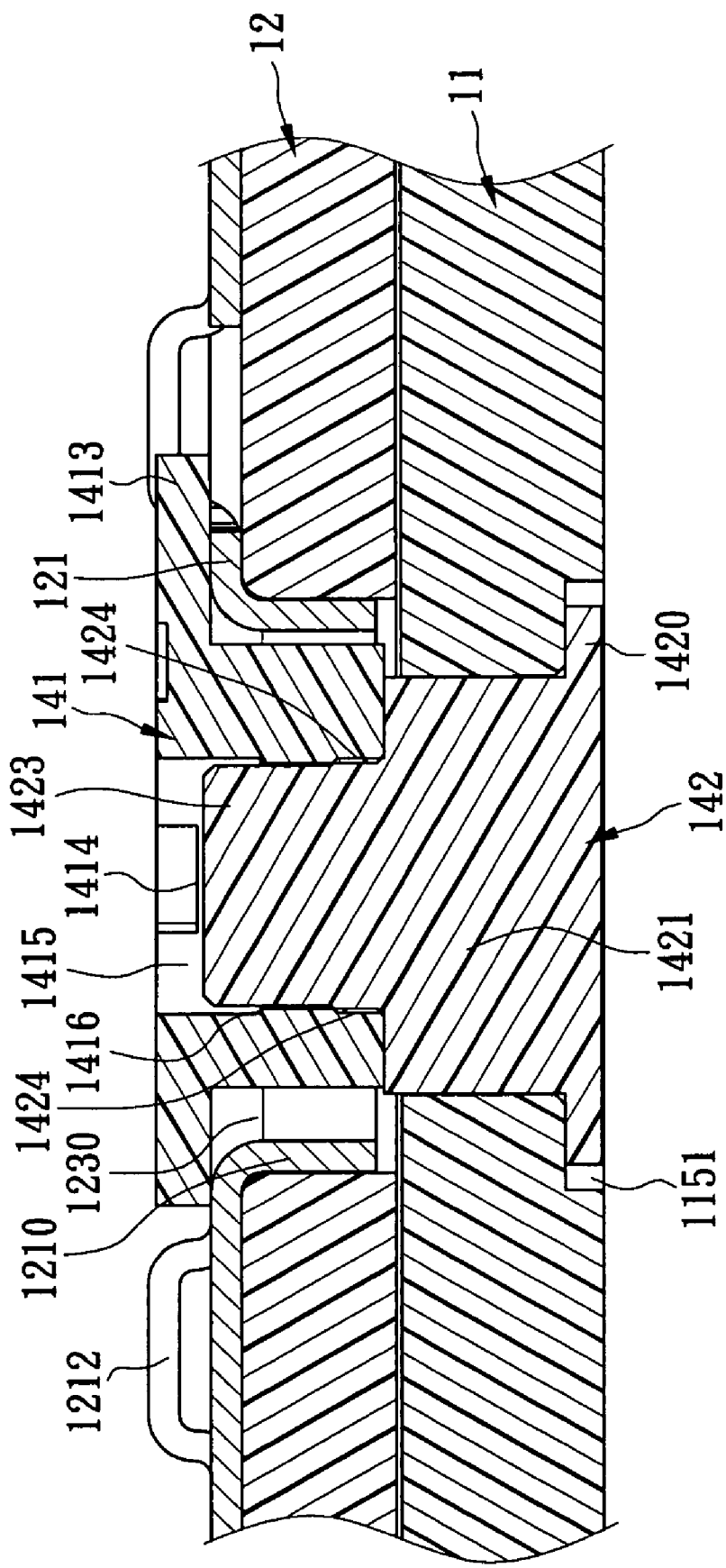
FIG. 11 is a cross-sectional diagram of the electrical connector of the third embodiment of the present invention.

Reference is made to FIG. 11, which shows the third embodiment. The difference between the third embodiment and the first embodiment is described below.

The lower driving element 142 does not have the riveting portion 1422. The middle portion 1421 extends to form a connection portion 1423. The connection portion 1423 forms the fastening portion. The lower side of the connection portion 1423 that is close to the middle portion 1421 has a first interference portion 1424 that is ring-shaped. The diameter of the first interference portion 1424 is larger than the diameter of the lower side of the fastening hole 1415. The diameter of the upper side of the connection portion 1423 is smaller than the diameter of the fastening hole 1415.

After the upper driving element 141 is assembled, the lower driving element 142 is plugged into the receiving hole 115 from the lower surface 111 of the base 11. The lower position-limit portion 1420 is received in the lower opening portion 1151 to block the lower driving element 142 and thus prevents the lower driving element 142 from escaping from the receiving hole 115 upwards. The middle portion 1421 is received in the upper opening portion 1150. The connection portion 1423 extends into the fastening hole 1415 of the upper driving element 141. By utilizing the interference between the first interference portion 1424 and the fastening hole 1415, the lower driving element 142 is connected with the upper driving element 141. Thereby, the electrical connector 1 is assembled. In this embodiment, by utilizing the interference, the lower driving element 142 is connected with the upper driving element 141 to achieve the same effect and goal of the first embodiment.

Alternatively, the first interference portion 1424 is not ring-shaped and is a convex portion that is disposed on the connection portion 1423. The first interference portion 1424 is not limited to be disposed at the lower portion of the connection portion 1423. The first interference portion 1424 may also be located at the upper portion of the connection portion 1423 or the whole external surface of the connection portion 1423.

Figure 12:
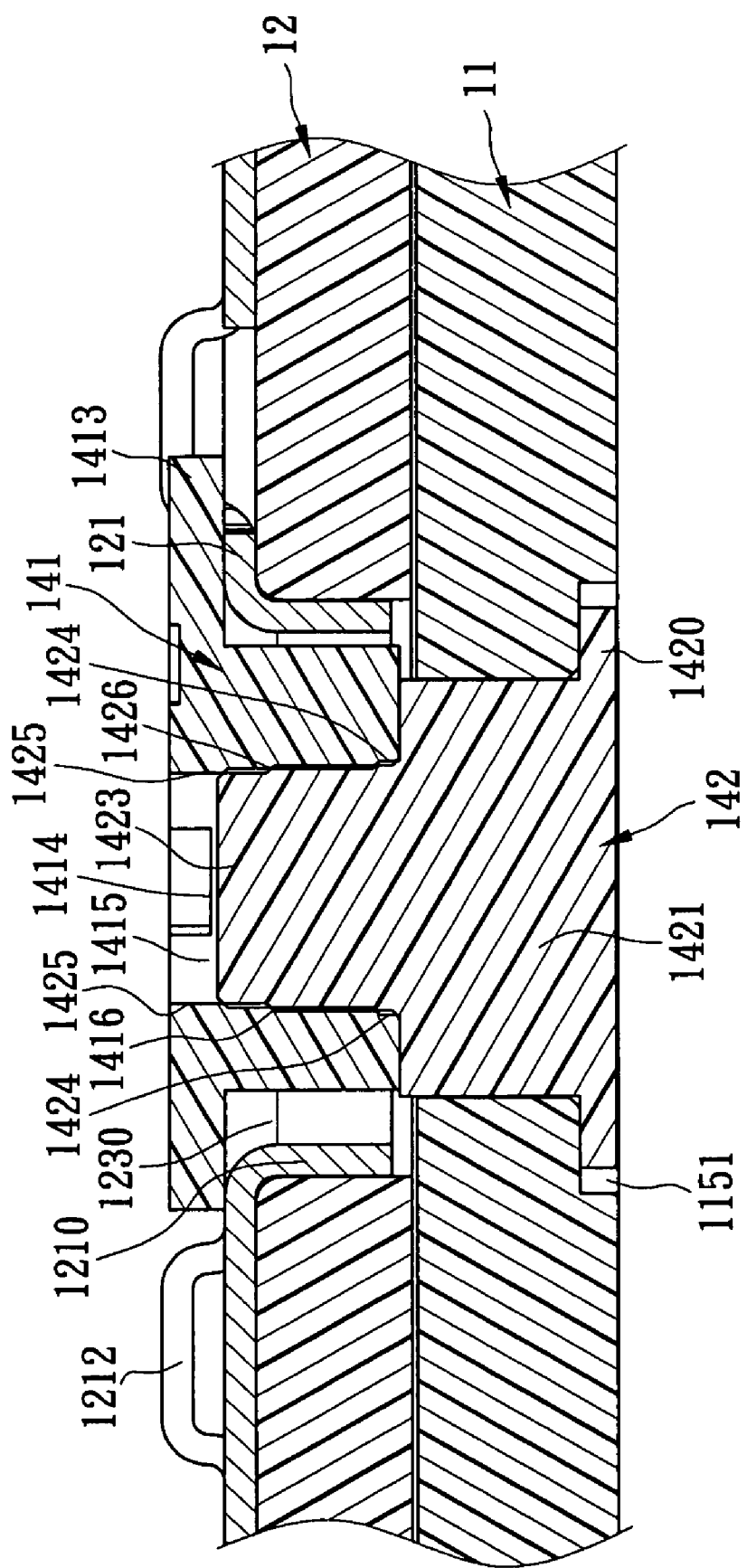
FIG. 12 is a cross-sectional diagram of the electrical connector of the fourth embodiment of the present invention.
Figure 13:
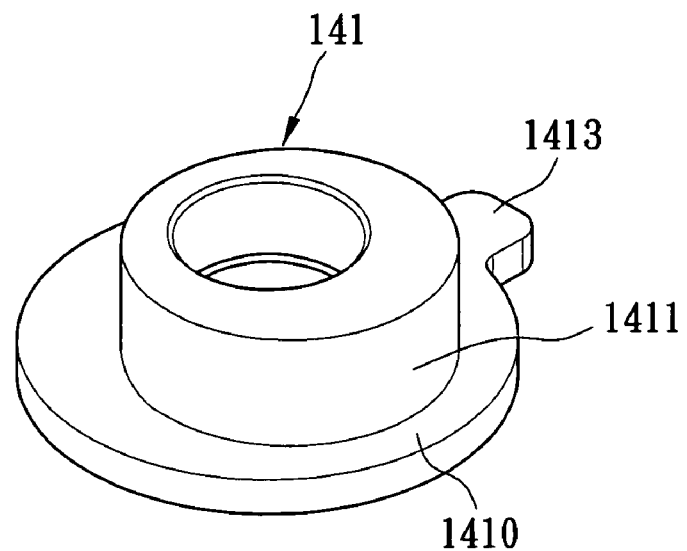
FIG. 13 is a perspective view of the upper driving element in FIG. 12.
Figure 14:
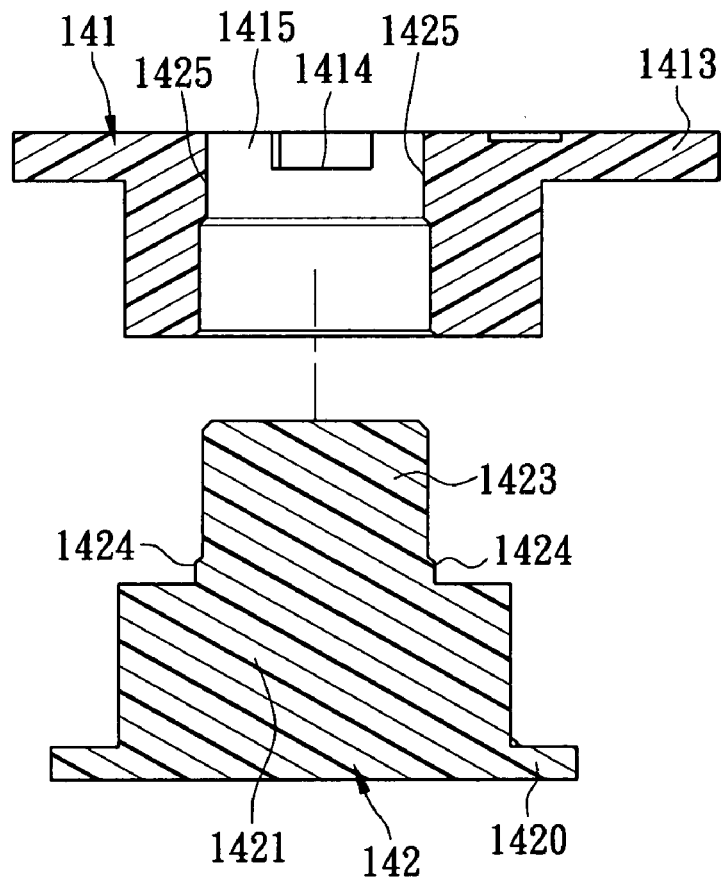
FIG. 14 is a cross-sectional diagram of the upper driving element and the lower driving element in FIG. 12.

Reference is made to FIGS. 12-14, which show the fourth embodiment. The difference between the fourth embodiment and the third embodiment is described below.

The upper side of the fastening hole 1415 has a second interference portion 1425 that is ring-shaped. The diameter of the second interference portion 1425 is smaller than the diameter of the upper portion of the connection portion 1423, and the second interference portion 1425 has a lower end point 1426. When the connection portion 1423 is plugged into the fastening hole 1415, the lower end point 1426 of the second interference portion 1425 is located at a location that the lower end point 1426 contacts the connection portion 1423 before the first interference portion 1424 contacts the fastening hole 1415.

After the upper driving element 141 is assembled, the lower driving element 142 is plugged into the receiving hole 115 from the lower surface 111 of the base 11. The lower position-limit portion 1420 is received in the lower opening portion 1151 to block the lower driving element 142 and prevent the lower driving element 142 from escaping upwards from the receiving hole 115. The middle portion 1421 is received in the upper opening portion 1150. As the connection portion 1423 is plugged, the upper side of the connection portion 1423 is interfered with and contacts the lower end point 1426 of the second interference portion 1425. Next, the connection portion 1423 is extended and plugged into the fastening hole 1415 continuously. Because the connection portion 1423 firstly is interfered with and contacts the lower end point 1426, the connection portion 1423 is guided to be smoothly plugged into the fastening hole 1415 and to be not slanted. Next, the upper side of the connection portion 1423 is interfered with the second interference portion 1425 of the fastening hole 1415. The first interference portion 1424 is interfered with the lower portion of the fastening hole 1415. By interfering the upper side of the connection portion 1423 with the second interference portion 1425 of the fastening hole 1415 and interfering the first interference portion 1424 with the lower portion of the fastening hole 1415, the lower driving element 142 is connected with the upper driving element 141.

During the interfering procedure, interfering the upper side of the connection portion 1423 with the second interference portion 1425 of the fastening hole 1415 guides the connection portion 1423 to be stably plugged into the fastening hole 1415 and so slanting does not occur.

Alternatively, the second interference portion 1425 may not be ring-shaped. The second interference portion 1425 can be a convex point located at the fastening hole 1415. The second interference portion 1425 is not limited to be located at the upper portion of the fastening hole 1415. The second interference portion 1425 can be located at the lower portion of the fastening hole 1415, or the whole inner surface of the fastening hole 1415.

Figure 15:
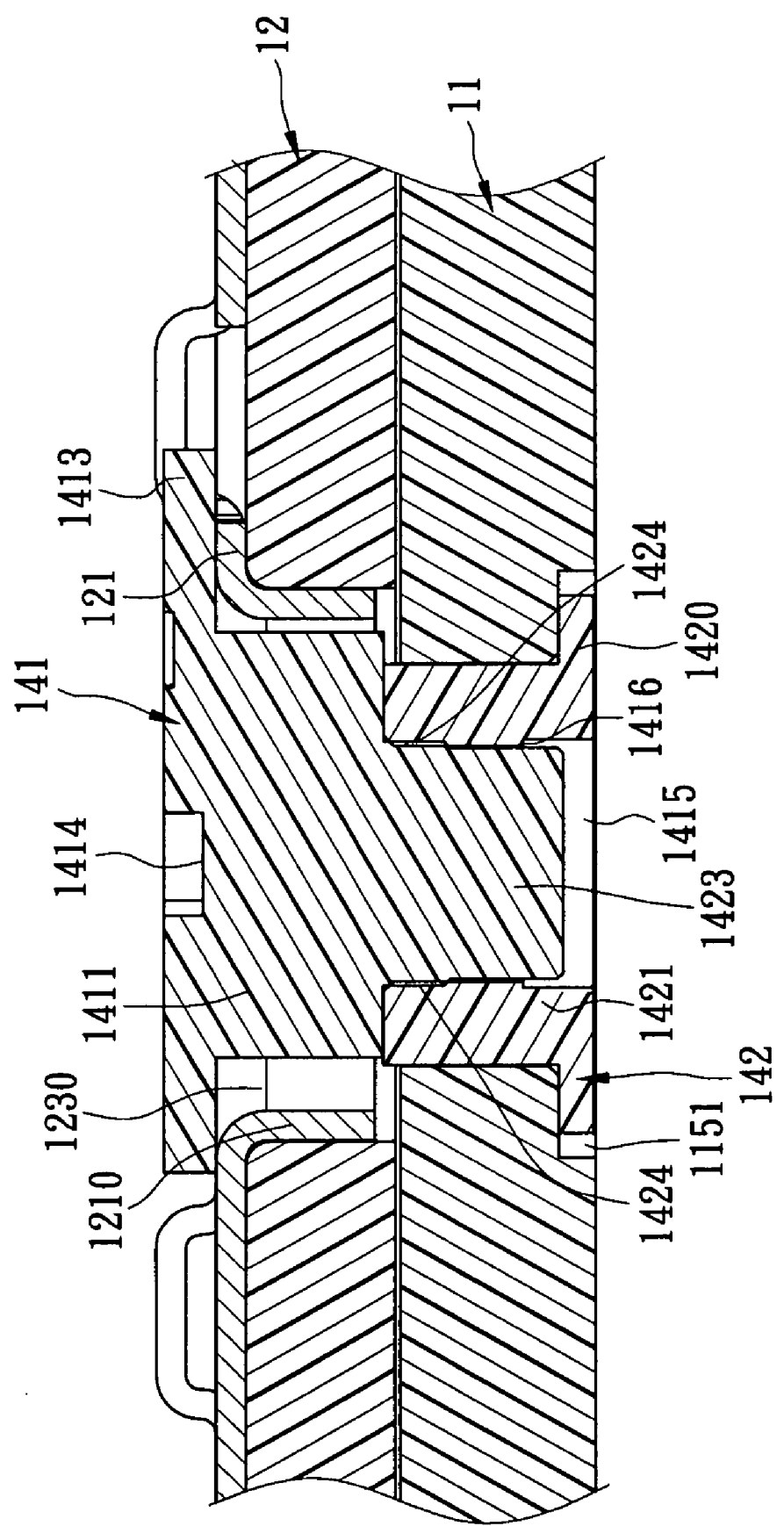
FIG. 15 is a cross-sectional diagram of the electrical connector of the fifth embodiment of the present invention.

Reference is made to FIG. 15, which shows the fifth embodiment. The difference between the fifth embodiment and the second embodiment is described below.

The upper driving element 141 is not installed with riveting portion 1422. The pushing portion 1411 extends to form the connection portion 1423. The connection portion 1423 forms the fastening portion. The upper side of the connection portion 1423 that is close to the pushing portion 1411 extends to form the first interference portion 1424. The diameter of the first interference portion 1424 is larger than the diameter of the upper portion of the fastening hole 1415.

During the assembly procedure, the first interference portion 1424 of the upper driving element 141 is interfered with the fastening hole 1415 of the lower driving element 142 so that the upper driving element 141 is connected with the lower driving element 142.

Figure 16:
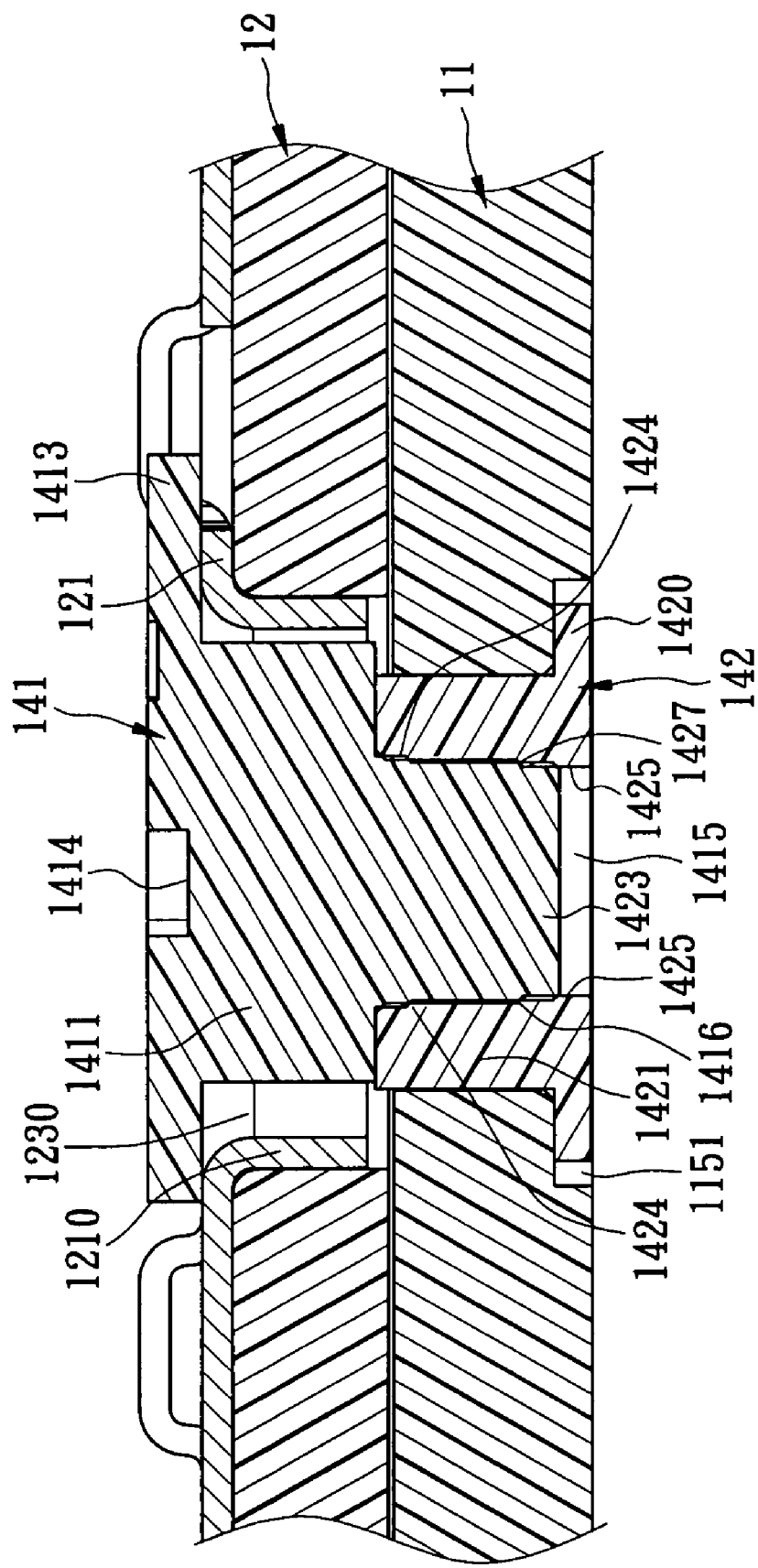
FIG. 16 is a cross-sectional diagram of the electrical connector of the sixth embodiment of the present invention.
Figure 17:
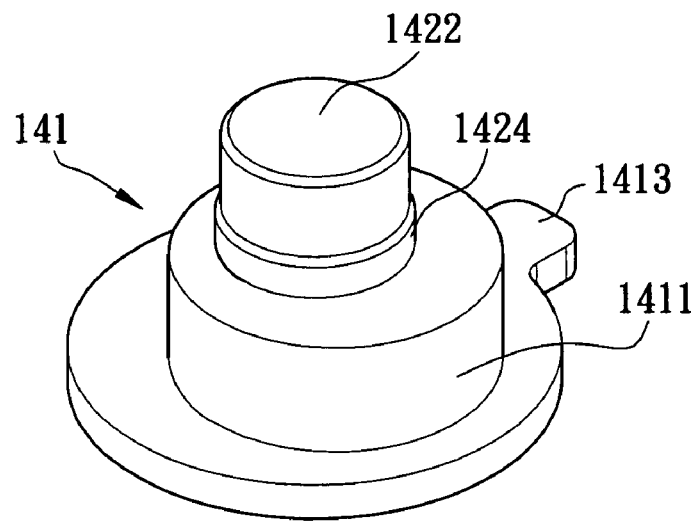
FIG. 17 is a perspective view of the upper driving element in FIG. 16.
Figure 18:
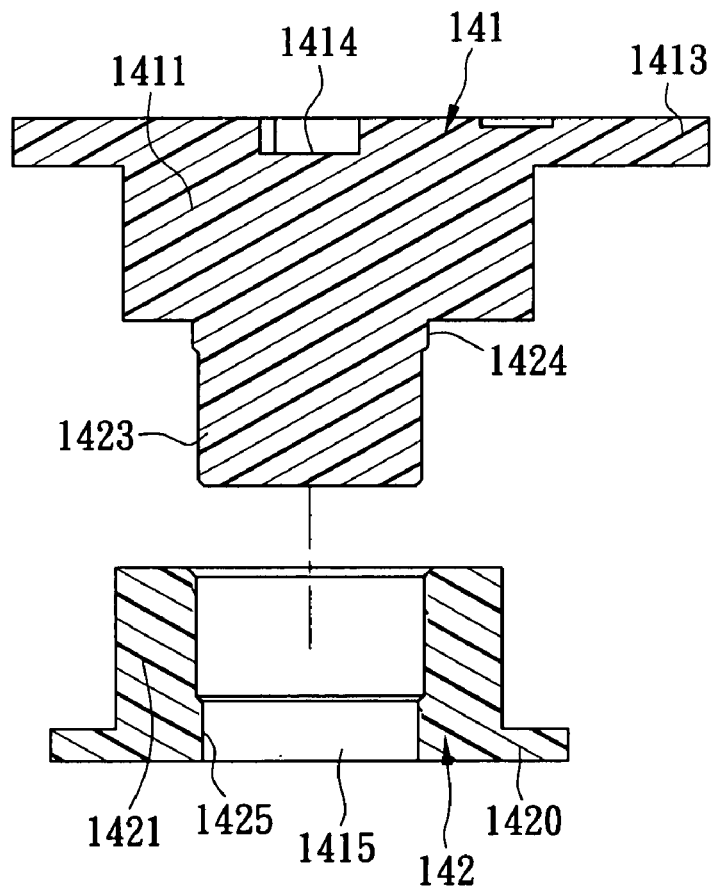
FIG. 18 is a cross-sectional diagram of the upper driving element and the lower driving element in FIG. 16.

Reference is made to FIGS. 16-18, which show the sixth embodiment. The difference between the sixth embodiment and the fifth embodiment is described below.

The lower side of the fastening hole 1415 has the second interference portion 1425. The diameter of the second interference portion 1425 is smaller than the diameter of the lower portion of the connection portion 1423. The second interference portion 1425 has an upper end point 1427. When the connection portion 1423 is plugged into the fastening hole 1415, the upper end point 1427 of the second interference portion 1425 is located at a location that the upper end point 1427 contacts the connection portion 1423 before the first interference portion 1424 contacts the fastening hole 1415.

During the assembly procedure, the upper driving element 141 is plugged into the through hole 1230 of the upper cover 12 from up to down. The operating portion 1410 is stopped on the upper surface of the pushing piece 121. The pushing portion 1411 is received in the through hole 1230, and the connection portion 1423 extends into the fastening hole 1415 of the lower driving element 142. As the connection portion 1423 is plugged, firstly, the lower portion of the connection portion 1423 is interfered with and contacts the upper end point 1427 of the second interference portion 1425. Next, the connection portion 1423 is plugged into the fastening hole 1415 continuously. Because the connection portion 1423 firstly is interfered with and contacts the upper end point 1427, the connection portion 1423 is guided to be smoothly plugged into the fastening hole 1415 and so slanting does not occur. Next, the lower side of the connection portion 1423 is interfered with the second interference portion 1425 of the fastening hole 1415. The first interference portion 1424 of the connection portion 1423 is interfered with the upper portion of the fastening hole 1415. By interfering the lower side of the connection portion 1423 with the fastening hole 1415 and interfering the first interference portion 1424 of the connection portion 1423 with the second interference portion 1425 of the fastening hole 1415, the lower driving element 142 is connected with the upper driving element 141.

Interfering the lower side of the connection portion 1423 with the second interference portion 1425 of the fastening hole 1415 guides the connection portion 1423 to be stably plugged into the fastening hole 1415 and so slanting does not occur.

Alternatively, the fastening way between the upper driving element 141 and the lower driving element 142 is not limited to the riveting way or the interfering way, and can be other ways.

The electrical connector of the present invention has the following characteristics.

1. For the electrical connector of the present invention, by riveting or interfering the upper driving element with the lower driving element, the pushing piece, the upper cover, and the base are located between the main body of the upper driving element and the lower blocking portion of the lower driving element. The main body blocks the upper surface of the pushing piece to forcedly press the pushing piece and the upper cover onto the base to prevent the upper cover from being warped, which would prevent the driving device from being operated normally.

2. Because the operating portion of the upper driving element is received in the through hole of the upper cover (as shown in the first embodiment), and the pushing portion of the upper driving element is received in the through hole of the upper cover, and the riveting portion is received in the fastening hole of the lower driving element (as shown in the second embodiment), therefore only the lower position-limit portion of the lower driving element occupies the thickness of the base during the sliding process. Comparing to the prior art, the thickness of the base exerted by the rotation force is very large so that the base does not deform and the driving device can be smoothly rotated.

The description above only illustrates specific embodiments and examples of the present invention. The present invention should therefore cover various modifications and variations made to the herein-described structure and operations of the present invention, provided they fall within the scope of the present invention as defined in the following appended claims.

What is claimed is:
1. An electrical connector, comprising:
  a base having a receiving hole;
  a cover body slidably disposed on the base, wherein the cover body has at least one convex column member, a through hole and at least one square hole, wherein the through hole corresponds to the receiving hole of the base;
  a plurality of pins received in the base;
  a pushing piece including at least one fastening piece attached to the upper surface of the cover body, at least one small circular hole, and an opening, wherein the pushing piece is fastened to and interfered with the cover body; and
  a driving device at least partially disposed in the receiving hole of the base, the through hole of the cover body, and the opening of the pushing device for enabling relative motion between the cover body and the base,
  wherein the driving device has an upper position-limit portion and a lower position-limit portion;
  wherein the pushing piece, the cover body and the base are located between the upper position-limit portion and the lower position-limit portion, and wherein the convex column member and the fastening piece are correspondingly interfered with and fastened to the small circular hole and the square hole.

2. The electrical connector as claimed in claim 1, wherein the pushing piece is drawn downwards to form a sleeve, the sleeve forms the opening, and the sleeve extends into the through hole.

3. The electrical connector as claimed in claim 1, wherein the driving device includes an upper driving element and a lower driving element that are connected, the upper driving element includes an operating portion and a pushing portion, the operating portion forms the upper position-limit portion, and the lower driving element includes the lower position-limit portion and a fastening portion.

4. An electrical connector, comprising:
a base having a receiving hole;
an upper cover body slidably disposed on the base, wherein the upper cover body has a through hole corresponding to the receiving hole of the base;
a plurality of pins received in the base; and
a driving device having an upper driving element and a lower driving element for enabling relative motion between the upper cover and the base,
wherein the upper driving element includes an operating portion and a pushing portion,
wherein the pushing portion is received in the through hole of the upper cover body,
wherein the lower driving element has a fastening portion received in the receiving hole of the base,
wherein the upper driving element has a fastening hole in the pushing portion rotatably coupled to the lower driving element,
and wherein a rotational center of the fastening hole is biased from a geometric center of the pushing portion.

5. The electrical connector as claimed in claim 4, wherein the lower portion of the inner surface of the fastening hole extends to form a convex portion, the lower driving element has a fastening portion that is formed by the riveting portion, the riveting portion extends into the fastening hole, and extends beyond the convex portion and an end of the riveting portion is riveted with the convex portion so that the upper driving element and the lower driving element are connected.

6. The electrical connector as claimed in claim 4, wherein the lower driving element has a fastening portion that is formed by the connection portion, and the lower portion of the connection portion has a first interference portion that is interfered with the fastening hole.

7. The electrical connector as claimed in claim 6, wherein the upper portion of the fastening hole has a second interference portion that is interfered and connected with the connection portion, the lower end point of the second interference portion is located at one location that the lower end point contacts the connection portion before the first interference portion contacts the fastening hole when the connection portion is plugged into the fastening hole.

8. The electrical connector as claimed in claim 4, wherein the upper cover body has a cover body and a pushing piece, the pushing piece is located at the cover body, and the upper driving element is stopped at the upper surface of the pushing piece.

9. The electrical connector as claimed in claim 4, wherein the operating portion forms an upper position-limit portion, the lower driving portion has a lower position-limit portion, and the pushing piece, the cover body, and the base are blocked between the upper position-limit portion and the lower position-limit portion.

10. An electrical connector, comprising:
a base having a receiving hole;
an upper cover body slidably disposed on the base, wherein the upper cover body has a through hole corresponding to the receiving hole of the base;
a plurality of pins received in the base; and
a driving device including an upper driving element and a lower driving element for pushing the upper cover and the base to have a relative motion,
wherein the upper driving element includes an operating portion and a pushing portion,
wherein the pushing portion is received in the through hole of the driving device,
wherein the lower driving element has a fastening portion received in the receiving hole of the base,
wherein the lower driving element has a fastening hole for rotatably coupling the upper driving element, and
wherein a rotation center of the fastening hole is biased from a geometric center of the fastening portion.

11. The electrical connector as claimed in claim 10, wherein the upper portion of the inner surface of the fastening hole extends to form a convex portion, the upper driving element has a riveting portion, the riveting portion extends into the fastening hole, and extends to beyond the convex portion and an end of the riveting portion is riveted with the convex portion so that the upper driving element and the lower driving element are connected.

12. The electrical connector as claimed in claim 10, wherein the upper driving element has a fastening portion that is formed by the connection portion, and the upper portion of the connection portion has a first interference portion that is interfered with the fastening hole.

13. The electrical connector as claimed in claim 12, wherein the lower portion of the fastening hole has a second interference portion that is interfered with and connected with the connection portion, the upper end point of the second interference portion is located at one location that the upper end point contacts the connection portion before the first interference portion contacts the fastening hole when the connection portion is plugged into the fastening hole.

* * * * *